United States Patent
Bertet

(10) Patent No.: US 11,592,503 B2
(45) Date of Patent: Feb. 28, 2023

(54) METHOD AND APPARATUS FOR HYPERPOLARISATION OF SPINS, IN PARTICULAR ELECTRON SPINS

(71) Applicant: COMMISSARIAT A L'ENERGIE ATOMIQUE ET AUX ENERGIES ALTERNATIVES, Paris (FR)

(72) Inventor: Patrice Bertet, Paris (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 341 days.

(21) Appl. No.: 16/765,136

(22) PCT Filed: Nov. 27, 2018

(86) PCT No.: PCT/EP2018/082646
§ 371 (c)(1),
(2) Date: May 18, 2020

(87) PCT Pub. No.: WO2019/105912
PCT Pub. Date: Jun. 6, 2019

(65) Prior Publication Data
US 2020/0284859 A1 Sep. 10, 2020

(30) Foreign Application Priority Data
Nov. 28, 2017 (FR) ........................ 1761273

(51) Int. Cl.
*G01R 33/28* (2006.01)
*G01R 33/32* (2006.01)
*G01R 33/56* (2006.01)

(52) U.S. Cl.
CPC ......... *G01R 33/282* (2013.01); *G01R 33/326* (2013.01); *G01R 33/5601* (2013.01)

(58) Field of Classification Search
CPC . G01R 33/282; G01R 33/326; G01R 33/5601
(Continued)

(56) References Cited

U.S. PATENT DOCUMENTS 8,703,102 B2 * 4/2014 Kalechofsky .......... A61K 49/10
560/231
8,703,201 B2 * 4/2014 Belzer ................ A61K 49/1815
424/9.3

(Continued)

FOREIGN PATENT DOCUMENTS

WO 2016/139419 A1 9/2016

OTHER PUBLICATIONS

Bienfait, et al., "Controlling Spin Relaxation with a Cavity", Nature, vol. 531, No. 7592, pp. 74-77, 2015.
(Continued)

*Primary Examiner* — Christopher P McAndrew
(74) *Attorney, Agent, or Firm* — BakerHostetler

(57) ABSTRACT

A method for hyperpolarizing spins includes the following steps: a) placing a sample containing spins (s) in a stationary magnetic field; b) magnetically coupling the sample to an electromagnetic resonator having a resonance frequency $\omega_0$ equal to the Larmor frequency of the spins in the stationary magnetic field, such that the coupling with the resonator dominates the relaxation dynamics of the spins; and c) reducing the effective temperature of the electromagnetic field inside the electromagnetic resonator below its physical temperature and that of the sample; whereby the polarization of the spins of the sample is established at a value higher than its thermal equilibrium value. An apparatus for implementing such a method is also provided.

18 Claims, 2 Drawing Sheets

(58) Field of Classification Search
USPC .......................................................... 324/309
See application file for complete search history.

(56) References Cited

U.S. PATENT DOCUMENTS

2003/0017110 A1* 1/2003 Pines ................ G01R 33/5601
424/9.6
2016/0109540 A1 4/2016 Borneman et al.

OTHER PUBLICATIONS

Butler, et al., "Polarization of nuclear spins by a cold nanoscale resonator", Physical Review A, vol. 84, No. 6, 063407, 2011.
Marquardt, et al., "Quantum Theory of Cavity-Assisted Sideband Cooling of Mechanical Motion", Physical Review Letters, 99, 093902, 2007.
Pfaff et al., "Controlled release of multiphoton quantum states from a microwave cavity memory", Nature Physics 13, pp. 882-887, 2017.
Bienfait, et al., "Reaching the quantum limit of sensitivity in electron spin resonance", Nature nanotechnology, vol. 11, No. 3, pp. 253-257, 2016.
Abragam, et al., "Principles of dynamic nuclear polarisation", Reports on Progress in Physics 41, pp. 395-467, 1978.
Goppl, et al., "Coplanar waveguide resonators for circuit quantum electrodynamics", Journal of Applied Physics 104, 113904, 2008.
Benningshof, et al., "Superconducting microstrip resonator for pulsed ESR of thin films", Journal of Magnetic Resonance, vol. 230, pp. 84-87, May 2013.
Zollitsch, et al., "High cooperativity coupling between a phosphorus donor spin ensemble and a superconducting microwave resonator", Applied Physics Letters, vol. 107, No. 14, 142105, 2015.

* cited by examiner

METHOD AND APPARATUS FOR HYPERPOLARISATION OF SPINS, IN PARTICULAR ELECTRON SPINS

CROSS-REFERENCE TO RELATED APPLICATIONS

This application is a National Stage of International patent application PCT/EP2018/082646, filed on Nov. 27, 2018, which claims priority to foreign French patent application No. FR 1761273, filed on Nov. 28, 2017, the disclosures of which are incorporated by reference in their entirety.

FIELD OF THE INVENTION

The invention relates to a method and an apparatus for hyperpolarizing spins. It applies primarily to electron paramagnetic resonance (EPR) spectroscopy, but also to nuclear magnetic resonance (NMR), to fundamental research in physics, to spintronics (exploitation of the quantum properties of the spins to store and process information), etc.

BACKGROUND

Electron paramagnetic resonance (EPR), also called electron spin resonance (ESR), denotes the property of certain electrons of interacting resonantly with an electromagnetic field when they are placed in a stationary magnetic field. Only unpaired electrons exhibit this property. Such electrons are found in radical chemical species, and in the salts and complexes of transition elements.

Thus, the electron paramagnetic resonance can be used as a spectroscopic technique to reveal the presence of unpaired electrons and determine the chemical and physical environment thereof.

As is also the case in nuclear magnetic resonance, the intensity of the electron paramagnetic resonance signal is proportional to the average spin polarization S, that is to say to the difference between the number of spins that are parallel and that are antiparallel to the stationary magnetic field, added to the total number of spins. In thermal equilibrium, the average spin polarization is governed by the Boltzmann law and depends therefore on the temperature T of the sample:

$$S_0 = \operatorname{Tanh}\left(\frac{\hbar\omega_0}{2kT}\right)$$

in which the index "0" denotes the thermal equilibrium value of the average spin polarization S, "Tanh" is the hyperbolic tangent function, $\omega_0$ is the electron paramagnetic resonance frequency (Larmor frequency)—and therefore $\hbar\omega_0$ is the energy difference between the two energy levels corresponding to the two possible orientations of the electron spins—k is the Boltzmann constant and T is the temperature in Kelvins. The Larmor frequency $\omega_0$ is given by $\omega_0 = \gamma B_0$ in which $\gamma$ is the gyromagnetic ratio and $B_0$ is the intensity of the stationary magnetic field.

In order to maximize the intensity of the EPR signal, and therefore the detection sensitivity, it is therefore necessary to minimize the temperature T and/or to maximize the intensity of the magnetic field $B_0$, such that $\hbar\omega_0 = \gamma B_0 > kT$. For example, for a band X spectrometer (working at $\omega_0/2\pi = 9$ GHz) at a temperature of T=2 K, the average polarization is $S_0 = 0.1$. If there were a desire to achieve a polarization close to 1, it would be necessary to lower the temperature of the sample below 0.3 K, which is much more costly technologically and financially. Likewise, there are technological limits to the intensity of the magnetic field, and it is also difficult to increase the resonance frequency beyond a few tens of GHz.

Another reason for increasing the polarization of a set of electron spins is that this polarization can be transferred to nuclear spins: this is called dynamic nuclear polarization (DNP). DNP is an essential technique for a large number of applications in nuclear magnetic resonance (NMR). There, the same difficulty mentioned above arises, that is to say the need to cool the sample containing the spins to be polarized to extremely low temperatures.

SUMMARY OF THE INVENTION

The invention aims to overcome these drawbacks of the prior art. More particularly, it aims to provide a method that is simple, economical and effective for increasing the polarization of a set of spins. Although an application of the invention to electron spins is considered preferentially, the method applies equally to nuclear spins. The latter do however exhibit a gyromagnetic ratio that is lower than that of the electrons by two or three orders of magnitude, which makes the implementation of the invention more restrictive.

According to the invention, this aim is achieved by hyperpolarizing the spins (that is to say by making the average polarization S higher than its equilibrium value $S_0$) by radiative cooling. More particularly, the hyperpolarization is obtained by strongly coupling the spins of the sample to a resonator supporting an electromagnetic field at the Larmor frequency whose effective temperature is lower than the physical temperature of the resonator. Several techniques, which will be described hereinbelow, make it possible to achieve this condition. The effective (or "photonic") temperature of an electromagnetic field in a resonator of resonance frequency $\omega/2\pi$ is understood to be the value $T_{\mathit{eff}}$ such that the average number $n_{ph}$ of photons of frequency $\omega/2\pi$ in the resonator is given by:

$$n_{ph} = \frac{1}{\exp\left(\frac{\hbar\omega}{kT_{\mathit{eff}}}\right) - 1}$$

In other words, $$T_{\mathit{eff}} = \left[\frac{k}{\hbar\omega_0}\ln\left(1 + \frac{1}{n_{ph}}\right)\right]^{-1}$$

By cooling the field instead of cooling the sample, or the resonator, the recourse to complex and costly cryogeny techniques is greatly limited.

One object of the invention is therefore a method for hyperpolarizing spins comprising the following steps:

a) placing a sample containing spins in a stationary magnetic field;

b) magnetically coupling the sample to an electromagnetic resonator having a resonance frequency $\omega_0$ equal to the Larmor frequency of the spins in the stationary magnetic field, the force of the coupling and the quality factor of the resonator being sufficiently high for the coupling with the resonator to dominate the relaxation dynamics of the spins; and c) reducing the effective temperature of the electromagnetic field inside the electromagnetic resonator below its physical temperature and that of the sample;

whereby the polarization of the spins of the sample is established at a value higher than its thermal equilibrium value.

According to particular embodiments of the invention:

The step c) can comprise the overcoupling of the electromagnetic resonator to a resistor maintained at a temperature lower than that of the electromagnetic resonator and that of the sample.

Alternatively, the step c) can comprise the coupling of the electromagnetic resonator to an auxiliary electromagnetic resonator having a resonance frequency $\omega_1$ and a damping ratio that are higher, the force of the coupling being modulated at a frequency $\omega_c = \omega_1 \omega_0$. In this case, the coupling of the electromagnetic resonator to the auxiliary electromagnetic resonator can notably be ensured by a device of SQUID type comprising a loop passed through by a magnetic field modulated at the frequency $\omega_c$, or else by a Josephson junction excited by two electromagnetic signals having respective frequencies whose difference is equal to $\omega_c$. Furthermore, the auxiliary electromagnetic resonator can be coupled to a resistor.

The electromagnetic resonator can be of superconductor type and have micrometric or sub-micrometric dimensions. It is then preferentially produced in planar technology.

The spins can in particular be electron spins.

Another object of the invention is the use of such a method to polarize a set of nuclear spins by dynamic nuclear polarization.

Yet another object of the invention is an apparatus for hyperpolarizing spins comprising:

a source of a stationary magnetic field;

an electromagnetic resonator that can be coupled to a sample containing spins and that can be immersed in the stationary magnetic field, the electromagnetic resonator having a resonance frequency $\omega_0$ equal to the Larmor frequency of the spins of the sample in the stationary magnetic field, the force of the coupling and the quality factor of the resonator being sufficiently high for the coupling with the resonator to dominate the relaxation dynamics of the spins of the sample; and a device making it possible to reduce the effective temperature of the electromagnetic field inside the electromagnetic resonator below its physical temperature.

According to particular embodiments of such an apparatus:

The device making it possible to reduce the effective temperature of the electromagnetic field inside the electromagnetic resonator below its physical temperature can comprise a resistor, a cryostat to maintain said resistor at a temperature lower than that of the electromagnetic resonator and a connection element overcoupling the resistor to the electromagnetic resonator.

As a variant, the device making it possible to reduce the effective temperature of the electromagnetic field inside the electromagnetic resonator below its physical temperature can comprise an auxiliary electromagnetic resonator having a resonance frequency $\omega_1$ and a damping ratio that are higher than those of the electromagnetic resonator, and a coupling device for coupling the electromagnetic resonator and the auxiliary electromagnetic resonator with a coupling force modulated at a frequency $\omega_c = \omega_1 - \omega_0$. The coupling device can comprise a device of SQUID type having a loop, and an alternating magnetic field source for generating a magnetic field modulated at the frequency $\omega_c$ passing through said loop, or else a Josephson junction and two sources of electromagnetic signals having respective frequencies whose difference is equal to $\omega_c$, arranged so as to excite said Josephson junction. Furthermore, the apparatus can also comprise a resistor coupled to the auxiliary electromagnetic resonator.

The electromagnetic resonator can be of superconductor type and have micrometric or sub-micrometric dimensions. It is then preferentially produced in planar technology.

BRIEF DESCRIPTION OF THE DRAWINGS

Other features, details and advantages of the invention will become apparent on reading the description given with reference to the attached drawings given by way of example and which represent, respectively.

DETAILED DESCRIPTION

The invention relies on an effect known as "Purcell spin effect". The Purcell effect is the enhancement of the spontaneous emission rate by an excited quantum system obtained by coupling with a resonance cavity tuned to the transition frequency. This effect was put forward in 1946 by E. M. Purcell, who was interested in the behavior of a set of nuclear spins in a magnetic field. However, it has primarily been observed and studied in the field of optical fluorescence. The Purcell spin effect was in fact observed only in 2016 by the present inventors and their collaborators [1], who applied it to speed up the return to thermal equilibrium of electron spins in an EPR spectrometer [2]. In the context of the invention, however, this effect is used for a completely different purpose, that is to say to obtain a spin polarization higher than that of thermal equilibrium. In other words, whereas in [1] and [2] the Purcell spin effect was used to bring a population of spins to equilibrium, in the invention this same effect makes it possible to bring such a population out of equilibrium.

Figure 1:
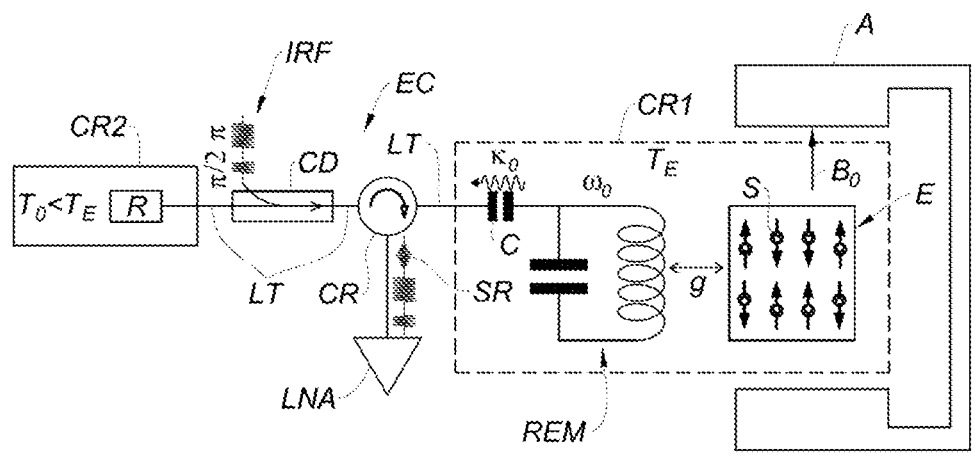
FIG. 1, an apparatus according to a first embodiment of the invention.

FIG. 1 shows an apparatus according to a first embodiment of the invention.

A sample E containing unpaired electron spins (represented symbolically by the reference s) is immersed in a stationary magnetic field $B_0$, that is uniform to the scale of the sample, generated by a magnet A. The spins are coupled magnetically to a microwave resonator REM (modeled by an LC resonant circuit) tuned to the Larmor frequency of the spins $\omega_0 = \gamma B_0$ (hereinbelow, for simplicity, the "angular frequency" or "pulsing" will be called "frequency"). The assembly consisting of the sample and the resonator is maintained at a temperature $T_E$, which is generally lower than ambient temperature (293 K) and preferably lies between 10 mK and 10 K, for example by placing it in a cryostat CR1, or simply a Dewar flask containing a cryogenic fluid. This temperature is not low enough to obtain the desired average polarization.

It is important for the spins to be located in what can be called the "Purcell regime", in which they are more strongly coupled to the photons of the resonator REM than to the photons of the sample, the relaxation dynamics being therefore dominated by the coupling with the resonator rather than by the thermal coupling to the sample. More quantitatively, g is used to denote the "spin-resonator coupling constant", defined as half the Rabi frequency of a spin when a microwave photon is present in the resonator; κ denotes the damping ratio of the microwave energy stored in the resonator, linked to the quality factor Q of the resonator by $\kappa_0 = \omega_0/Q$, $TR_P$ is used to denote the "Purcell relaxation time" defined as $TR_P = \kappa_0/(4g^2)$ and $TR_1$ is used to denote the relaxation time of the spins due to the coupling with the phonons. The Purcell regime is then defined as the regime where $TR_P \ll TR_1$ (for example $TR_1 \geq 10\ TR_P$). For this condition to be able to be satisfied, it is necessary to maximize both the coupling constant g and the quality factor Q of the resonator. To maximize the coupling constant g, it is best to miniaturize the resonator, which should preferably have at least two micrometric or sub-micrometric dimensions (less than 100 μm and preferably than 1 μm). To maximize the quality factor Q, it is best to use a superconductor resonator. A concrete realization of a resonator making it possible to achieve the Purcell regime is described in the reference [1] and hereinbelow with reference to FIG. 4. This same resonator had already been used for a high-sensitivity EPR spectroscopy technique: see the references [5] and [6].

In the Purcell regime, the value of the average polarization of the spins is determined by the average number "n" of photons in the resonator. In the case where the microwave field inside the resonator is at the temperature of the sample $T_E$, the average number of photons is $n_{th} = 1/\exp(\hbar\omega_0/kT_E) - 1$), in which the index "th" is a reminder that this condition corresponds to the thermal equilibrium. It would be possible, in principle, to increase the average polarization of the spins above its thermal equilibrium value by cooling the resonator below the temperature of the sample, but that is neither easy nor advantageous. Thus, according to the invention, it is proposed to lower the average number of photons in the resonator below its thermal equilibrium value.

In the embodiment of FIG. 1, that can be qualified as "passive", that is obtained by coupling the resonator REM to a resistor R which is, for its part, maintained at a temperature $T_0$ that is lower—and preferably very much lower, for example by a factor of 10 (in Kelvins) or more—than that ($T_E$) of the sample-resonator assembly. For that, the resistor R is placed in a cryostat CR2. The coupling between the resonator and the resistor can be ensured by a simple waveguide or transmission line—for example planar or coaxial—such that the resistor R constitutes an appropriate load. Typically, a resistor R will therefore be chosen with a value equal to 50Ω, which is the characteristic impedance of most of the coaxial cables on the market. In the case of FIG. 1, however, the connection element EC is more complex and comprises, in addition to a transmission line LT, a decoupling capacitor C mounted in series and a circulator CR and a directional coupler CD. The directional coupler makes it possible to inject radiofrequency pulses IRF for exciting the nuclear spins (for example a "π/2" pulse followed by a "π" pulse), and the circulator makes it possible to extract a response signal SR from the nuclear spins to transmit it to an acquisition chain (the reference LNA denotes a low-noise amplifier in this chain).

It is important for the resonator REM to be "overcoupled" to the resistor R, that is to say for the damping of the field in the cavity to be done essentially by leakage of the field to the resistor via the coupling element. More quantitatively, the resonator is overcoupled if the ratio at which the absorption of the energy stored in the cavity occurs because of internal losses $\kappa_i$ is very much lower (for example by a factor of 10 or more) than the total damping ratio $\kappa_0$. In these conditions, the average number of photons in the resonator will be established at a value $n_{low}$ lower than that of thermal equilibrium, and close to that which would correspond to a temperature $T_0$: $n_{low} \approx 1/(\exp(\hbar\omega_0/kT_0) - 1)$.

It is then said that the field has been cooled to an effective temperature $T_{eff}$ close to that of the resistor R ($T_{eff} \approx T_0$), whereas the "physical" temperature of the resonator remains equal to $T_E \gg T_0$. That produces the hyperpolarization that is sought. More specifically, the spin polarization then reaches the value $S' = 1/(1 + 2n_{low})$. The increasing of the spin polarization by Purcell effect is therefore given by the factor $(1 + 2n_{th})/(1 + 2n_{low})$.

Figure 2:
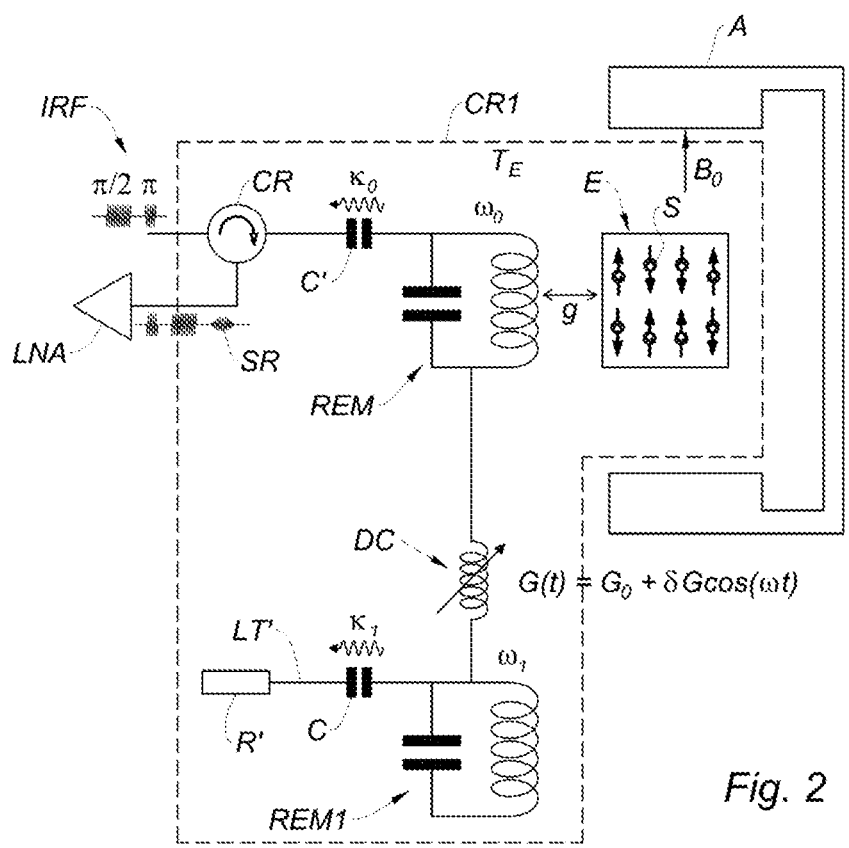
FIG. 2, an apparatus according to a second embodiment of the invention.

The apparatus of FIG. 1 is advantageous because it does not necessitate cooling the sample, or the resonator, but only a resistor which can be distant from the latter. Nevertheless, the cooling of the resistor to a temperature $T_0$ which is typically of the order of a few milliKelvin necessitates the implementation of fairly sophisticated cryogeny means. The embodiment of FIG. 2, that can be qualified as "active" cooling of the electromagnetic field, makes it possible to eliminate any recourse to such means.

As in the case of FIG. 1, a sample E containing unpaired electron spins s is immersed in a stationary magnetic field $B_0$, uniform to the scale of the sample, generated by a magnet A. The spins are coupled magnetically to a first microwave resonator REM (modeled by an LC resonant circuit) tuned to the Larmor frequency of the spins $\omega_0 = \gamma B_0$, such that the system is in Purcell regime, as defined above. The first resonator is coupled to a second microwave resonator REM1, or auxiliary resonator (also modeled by an LC resonant circuit), tuned to a frequency $\omega_1$ higher than $\omega_0$, preferably by at least a factor of 10. Furthermore, the damping ratio $\kappa_1$ of the second resonator REM1 can be very much higher (preferably by at least a factor of 10) than that, $\kappa_0$, of the first resonator. That is obtained by coupling the second resonator to a resistor R' via a transmission line LT' or a waveguide of suitable impedance, and a capacitor in series C. The injection of the spin excitation signals and the extraction of the response signal are done, for example, via the circulator CR linked to the first resonator by a capacitor in series C'.

The first resonator and the second resonator are coupled by a coupling device DC having a coupling force G modulated temporally to a frequency $\omega_c$ equal (with an error preferably not greater than the sum of the spectral widths of the two resonators) to the difference between the resonance frequencies of the two resonators: $\omega_c = \omega_1 - \omega_0$. A sinusoidal modulation $G(t) = G_0 + \delta G \cdot \cos(\omega_c t)$ can for example be considered.

The force of the coupling G represents the frequency at which the energy of a resonator would be transmitted to the other, if they were placed at the same frequency.

The assembly consisting of the sample, the two resonators, the resistor and the coupling device is maintained at a temperature $T_E$, which is generally lower than ambient temperature (293 K) and preferably lies between 10 mK and 10 K, for example by placing it in a cryostat CR1, or simply a Dewar flask containing a cryogenic fluid.

It is possible to show that, in these conditions, the average number of photons in the two resonators tend toward equality (see [3], which explains the theory of the active cooling of a mechanical nano-oscillator). Now, given that $\omega_1 \gg \omega_0$, for a given temperature the average number of photons in the second resonator is very much lower than in the first resonator (this is a direct consequence of the Bose-Einstein statistic).

More specifically, it is possible to show that, under the action of the coupling to the second resonator, the first resonator sees its damping ratio increase to an induced ratio $\kappa_{ind} = \kappa_0 + 4\delta G^2/\kappa_1$, and that the number of photons in permanent regime in the first resonator becomes $n_{low} = [n_{th0}\kappa_0 + n_{th1}\kappa_{ind}]/(\kappa_0 + \kappa_{ind})$ in which $n_{th0}$ and $n_{th1}$ are the average numbers of photons in the first and second resonators at thermal equilibrium at the temperature $T_E$.

This result is valid if $\delta G < \kappa_1 < \omega_0$, which corresponds to what is called the "resolved sideband limit". That corresponds to a situation in which the sidebands generated by the modulation of the coupling around the frequency $\omega_1$ have a frequency difference greater than the spectral width of the oscillation signal of the second resonator. It is assumed here that this condition is satisfied. More particularly, the method functions optimally when $\delta G >> \sqrt{\kappa_0 \kappa_1}$ (for example $\delta G \geq 10 \sqrt{\kappa_0 \kappa_1}$). In this case, the induced damping ratio of the first resonator $\kappa_{ind}$ is very much higher than its "natural" ratio $\kappa_0$ and $n_{low} \approx n_{th0}(\kappa_0/\kappa_{ind}) + n_{th1}$ is obtained. Based on the chosen parameters, the number of photons in the first resonator can be reduced by up to two orders of magnitude. That will be directly reflected in an increase by two orders of magnitude of the polarization of the spins S and therefore of the spin echo signal.

It has been stated above that the method works only if the Purcell regime condition, $TR_P >> TR_1$ is verified. Now, it is essential take account of the fact that the modulation of the coupling leads to an increasing of the effective damping of the first resonator $\kappa_{ind}$, and therefore to an effective elongation of the Purcell relaxation time. For the spins to be located in Purcell regime it is therefore necessary for $\kappa_{ind}/(4g^2) << TR_1$, or even $(\delta G/g)^2 << TR_1 \kappa_1$. In other words, compared to the first embodiment, it is even more important to maximize the spin-resonator coupling constant by miniaturizing the latter.

Different embodiments of the coupling device DC can be used in the context of the invention.

Figure 3A:
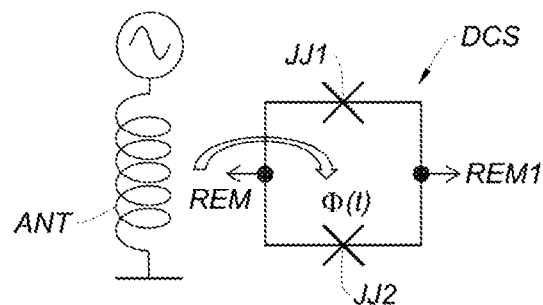
FIGS. 3A and 3B, two coupling devices that can be used in respective variants of the apparatus of FIG. 2.

In the example of FIG. 3A, the resonators REM and REM1 are connected—possibly via a respective capacitor—to the two terminals of a device DCS of SQUID ("Superconducting Quantum Interference Device") type, comprising two Josephson junctions JJ1 and JJ2 forming a loop. An antenna ANT (for example a simple inductor) is arranged close to the device, powered by a radiofrequency generator at the frequency moo, generates a magnetic field, and therefore a magnetic flux ΦM through the loop, that are variable at this same frequency. The magnetic flux can possibly also have a constant component.

Figure 3B:
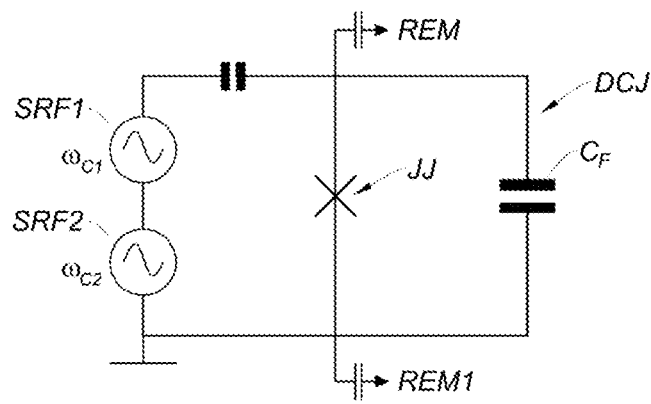

In the example of FIG. 3B, the resonators REM and REM1 are connected—via a respective capacitor—to the two terminals of a Josephson junction JJ excited by two signals at respective frequencies $\omega_{c1}$, $\omega_{c2}$ such that $|\omega_{c1} - \omega_{c2}| = \omega_c$. For example, these signals are supplied, via a capacitive coupling, by two radiofrequency voltage generators SRF1, SRF2 connected in series. A capacitor $C_F$ can be connected in parallel to the Josephson junction to lower its natural resonance frequency. The reference DCJ designates the coupling device comprising the Josephson junction JJ, the generators SRF1, SRF2, the coupling capacitors and, if appropriate, the capacitor $C_F$.

Figure 4:
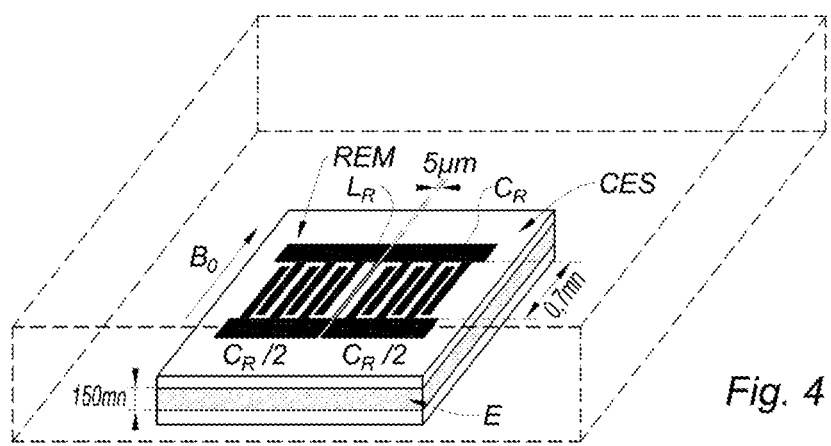
FIG. 4, an electromagnetic resonator that can be used in the apparatuses of FIGS. 1 and 2.

FIG. 4 shows a device incorporating both the sample E and the first resonator REM. The sample, used in order to demonstrate the technique, consists of a layer of bismuth atoms (Bi) implanted, at a depth of 150 nm, in an epitaxial layer CES of silicon 28 ($^{28}$Si, obtained by isotopic enrichment, so as to eliminate disturbances induced by the nuclear spin of the isotope $^{29}$Si). Since bismuth is an element from group V, each implanted atom gives a "free" electron to the silicon crystal; the spins having to be polarized are those of these electrons. A planar LC resonator, REM, is produced on the surface of the epitaxial layer by deposition and etching of a layer of aluminum, which becomes a superconductor below 1.2 K. The resonator REM consists of an interdigitated capacitor $C_R$ and an inductor $L_R$. The capacitor $C_R$ is formed by two main parallel conductive tracks, from which conductive "fingers" extend at right angles to the tracks. The fingers which start from a track are inserted between those which start from the other track. The inductor $L_R$ consists of a rectilinear conductive track which links the two main tracks of the capacitor. It is arranged in the central part of the resonator, such that it divides the capacitor $C_R$ into two symmetrical parts ($C_R/2$) that are connected in parallel. The resonator is inserted into a copper housing BC (represented by a dotted line) to eliminate the radiative losses. Radiofrequency signals are injected and extracted by asymmetrical antennas (not represented). The magnetic field $B_0$ is parallel to the inductor. The assembly is maintained at a temperature of 12 mK.

With eight pairs of fingers 700 μm long and an inductor 5 μm wide, the resonator REM has a resonance frequency of 7.24 GHz and a loaded quality factor of $3 \cdot 10^8$ at this same frequency.

In an application of the technique to electron paramagnetic resonance spectroscopy, the sample will for example consist of a drop of solution to be analyzed deposited on the planar resonator (with, if necessary, the interpositioning of a thin electrical passivation/insulation layer).

The invention has been described by referring primarily to its application to electron paramagnetic resonance spectroscopy, but it applies more generally to any situation in which it is advantageous to increase the polarization of a set of spins beyond thermal equilibrium. For example, the polarization of a set of electron spins is also used in dynamic nuclear polarization (DNP), to polarize in return a set of nuclear spins. The invention can therefore be applied to dynamic nuclear polarization. For that, a substance which contains both unpaired electron spins and nuclear spins is disposed in immediate proximity to the resonator REM. The electron spins are polarized in accordance with the invention; an electromagnetic field of frequency equal to the difference between the Larmor frequencies of the electron and nuclear spins induces a coupling between the latter, and transfers the polarization to the nuclear spins. See [7] for more details.

The invention is also not limited to the hyperpolarization of electron spins. It can also be applied directly to the case of nuclear spins. Nevertheless, that is more difficult because, for the nuclear spins, the spin-resonator coupling constant g is lower by a factor of approximately $10^3$ compared to the electron case, and therefore the Purcell relaxation time is higher by a factor of $10^6$. Furthermore, for a given magnetic field, the Larmor frequencies of the nuclear spins are lower, and therefore the equilibrium polarizations are lower.

Other methods that make it possible to "cool" the electromagnetic field inside a resonator can be envisaged and used in the context of the present invention.

Only the case of a superconductor electromagnetic resonator of planar type has been considered, but other technologies can be used, for example cavity resonators. The dimensioning is given purely by way of example.

Regarding the embodiment with active cooling, two coupling devices have been described in detail, but these are only examples given in a nonlimiting manner.

REFERENCES

[1] "Controlling Spin Relaxation with a Cavity", A. Bienfait, J. J. Pla, Y. Kubo, X. Zhou, M. Stern, C. C Lo, C. D. Weis, T. Schenkel, D. Vion, D. Esteve, J. J. L. Morton, P. Bertet, Nature 531, 74 (2016)
[2] "Polarization of nuclear spins by a cold nanoscale resonator", Mark C. Butle, Daniel P. Weitekamp, Phys. Rev. A 84, 063407
[3] "Quantum Theory of Cavity-Assisted Sideband Cooling of Mechanical Motion", Florian Marquardt, Joe P. Chen, A. A. Clerk, S. M. Girvin, Phys. Rev. Lett. 99, 093902
[4] "Controlled release of multiphoton quantum states from a microwave cavity memory", W. Pfaff, C. J. Axline, L. D. Burkhart, U. Vool, P. Reinhold, L. Frunzio, L. Jiang, M. H. Devoret, R. J. Schoelkopf, Nature Physics 13, 882-887 (2017)
[5] "Reaching the quantum limit of sensitivity in electron spin resonance" Bienfait, A., Pla, J. J., Kubo, Y., Stern, M., Zhou, X., Lo, C. C., Esteve, D. (2016). Nature nanotechnology, 11(3), 253-257.
[6] WO 2016/139419
[7] A. Abragam, M. Goldman, "Principles of dynamic nuclear polarisation", Reports on Progress in Physics 41, 395-467 (1978).

The invention claimed is:

1. A method for hyperpolarizing spins comprising the following steps:
a) placing a sample (E) containing spins (s) in a stationary magnetic field ($B_0$);
b) magnetically coupling the sample to an electromagnetic resonator (REM) having a resonance frequency $\omega_0$ equal to the Larmor frequency of the spins in the stationary magnetic field wherein the coupling of the sample with the electromagnetic resonator is configured to dominate the relaxation dynamics of the spins wherein the following condition applies:
TRP<<TR1
where TRP is a Purcell relaxation time defined as TRP=$\kappa 0/(4g2)$,
$\kappa 0$ is a damping ratio of microwave energy stored in the electromagnetic resonator, where $\kappa 0 = \omega \theta / Q$, Q being a quality factor of the electromagnetic resonator, g is a spin-resonator coupling constant defined as half a Rabi frequency of a spin when a microwave photon is present in the electromagnetic resonator, and TR1 is a relaxation time of spins due to the coupling with phonons in the electromagnetic resonator; and
c) reducing the effective temperature $$T_{eff} = \left[\frac{k}{\hbar\omega_0} \ln\left(1 + \frac{1}{n_{ph}}\right)\right]^{-1}$$

of the electromagnetic field inside the electromagnetic resonator below its physical temperature and that of the sample, k being the Boltzmann constant, h being the reduced Planck constant and $n_{ph}$ being the average number $n_{ph}$ of photons of frequency $\omega_0$ in the resonator;
whereby the polarization of the spins of the sample is established at a value higher than its thermal equilibrium value.

2. The method as claimed in claim 1, wherein the step c) comprises the overcoupling of the electromagnetic resonator to a resistor (R) maintained at a temperature lower than that of the electromagnetic resonator and that of the sample.

3. The method as claimed in claim 1, wherein the step c) comprises the coupling of the electromagnetic resonator to an auxiliary electromagnetic resonator ($REM_1$) having a resonance frequency $\omega_1$ and a damping ratio that are higher, the force of the coupling being modulated at a frequency $\omega_c = \omega_1 - \omega_0$.

4. The method as claimed in claim 3, wherein the coupling of the electromagnetic resonator to the auxiliary electromagnetic resonator is ensured by a device of SQUID type (DCS) comprising a loop that is passed through by a magnetic field modulated at the frequency $\omega_c$.

5. The method as claimed in claim 3, wherein the coupling of the electromagnetic resonator to the auxiliary electromagnetic resonator is ensured by a Josephson junction (JJ) excited by two electromagnetic signals having respective frequencies whose difference is equal to $\omega_c$.

6. The method as claimed in claim 3, wherein the auxiliary electromagnetic resonator is coupled to a resistor (R').

7. The method as claimed in claim 1, wherein the electromagnetic resonator (REM) is of superconductor type and has micrometric or sub-micrometric dimensions.

8. The method as claimed in claim 7, wherein the electromagnetic resonator is produced in planar technology.

9. The method as claimed in claim 1, wherein the spins are electron spins.

10. The use of a method as claimed in claim 9, to polarize a set of nuclear spins by dynamic nuclear polarization.

11. An apparatus for hyperpolarizing spins comprising:
a source (A) of a stationary magnetic field ($B_0$);
an electromagnetic resonator (REM) that can be coupled to a sample (E) containing spins (s) and that can be immersed in the stationary magnetic field, the electromagnetic resonator having a resonance frequency $\omega_0$ equal to the Larmor frequency of the spins of the sample in the stationary magnetic field, wherein the coupling of the sample with the electromagnetic resonator is configured to dominate the relaxation dynamics of the spins wherein the following condition applies:
TRP<<TR1
where TRP is a Purcell relaxation time defined as TRP=$\kappa 0/(4g2)$,
$\kappa 0$ is a damping ratio of microwave energy stored in the electromagnetic resonator, where $\kappa 0 = \omega 0/Q$, Q being a quality factor of the electromagnetic resonator, g is a spin-resonator coupling constant defined as half a Rabi frequency of a spin when a microwave photon is present in the electromagnetic resonator, and TR1 is a relaxation time of spins due to the coupling with phonons in the electromagnetic resonator; and
a device configured to reduce the effective temperature of the electromagnetic field inside the electromagnetic resonator below its physical temperature.

12. The apparatus as claimed in claim 11, wherein the device making it possible to reduce the effective temperature of the electromagnetic field inside the electromagnetic resonator below its physical temperature comprises a resistor (R), a cryostat (CR2) to maintain said resistor at a temperature ($T_0$) lower than that ($T_E$) of the electromagnetic resonator and a connection element (EC) overcoupling the resistor to the electromagnetic resonator.

13. The apparatus as claimed in claim 11, wherein the device making it possible to reduce the effective temperature of the electromagnetic field inside the electromagnetic resonator below its physical temperature comprises an auxiliary electromagnetic resonator (REM1) having a resonance frequency Wi and a damping ratio that are higher than those of the electromagnetic resonator, and a coupling device (DC, DCS, DCJ) for coupling the electromagnetic resonator and the auxiliary electromagnetic resonator with a coupling force modulated at a frequency $\omega_c=\omega 1-\omega 0$.

14. The apparatus as claimed in claim 13, wherein the coupling device (DCS) comprises a device of SQUID type (DCS) having a loop, and an alternating magnetic field source (ANT) for generating a magnetic field modulated at the frequency Wc passing through said loop.

15. The apparatus as claimed in claim 13, wherein the coupling device (DCJ) comprises a Josephson junction (JJ) and two electromagnetic signal sources (SRF1, SRF2) having respective frequencies whose difference is equal to $\omega_c$, arranged so as to excite said Josephson junction.

16. The apparatus as claimed in claim 13, also comprising a resistor (R') coupled to the auxiliary electromagnetic resonator.

17. The apparatus as claimed in claim 11, wherein the electromagnetic resonator (REM) is of semiconductor type and has micrometric or sub-micrometric dimensions.

18. The apparatus as claimed in claim 17, wherein the electromagnetic resonator is produced in planar technology.

* * * * *

UNITED STATES PATENT AND TRADEMARK OFFICE
CERTIFICATE OF CORRECTION

PATENT NO.        : 11,592,503 B2
APPLICATION NO.   : 16/765136
DATED             : February 28, 2023
INVENTOR(S)       : Patrice Bertet It is certified that error appears in the above-identified patent and that said Letters Patent is hereby corrected as shown below:

In the Claims

In Claim 1, Column 9, Line 46, "where $\kappa 0 = \omega\theta/Q$" should be -- where $\kappa 0 = \omega 0/Q$ --.

In Claim 13, Column 11, Line 3, "a resonance frequency $W_i$" should be -- a resonance frequency $\omega_1$ --.

In Claim 13, Column 11, Line 7, "at a frequency $\omega_c = \omega 1 - \omega 0$." should be -- at a frequency $\omega_c = \omega_1 - \omega_0$. --.

In Claim 14, Column 11, Line 12, "at the frequency $W_c$ passing through said loop." should be -- at the frequency $\omega_c$ passing through said loop. --.

Signed and Sealed this
Thirtieth Day of May, 2023

Katherine Kelly Vidal
*Director of the United States Patent and Trademark Office*